US012604665B2

(12) United States Patent
Nakamura et al.

(10) Patent No.: US 12,604,665 B2
(45) Date of Patent: Apr. 14, 2026

(54) MULTILAYER STRUCTURE, PIEZOELECTRIC DEVICE USING THE SAME, MANUFACTURING METHOD OF MULTILAYER STRUCTURE, AND MANUFACTURING METHOD OF PIEZOELECTRIC DEVICE

(71) Applicant: Nitto Denko Corporation, Ibaraki (JP)

(72) Inventors: Daisuke Nakamura, Ibaraki (JP); Taketo Ishikawa, Ibaraki (JP); Gaku Tsuburaoka, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 842 days.

(21) Appl. No.: 17/913,541

(22) PCT Filed: Mar. 12, 2021

(86) PCT No.: PCT/JP2021/010223
§ 371 (c)(1),
(2) Date: Sep. 22, 2022

(87) PCT Pub. No.: WO2021/193167
PCT Pub. Date: Sep. 30, 2021

(65) Prior Publication Data
US 2023/0103499 A1 Apr. 6, 2023

(30) Foreign Application Priority Data

Mar. 24, 2020 (JP) ................................ 2020-052354
Sep. 17, 2020 (JP) ................................ 2020-156573

(51) Int. Cl.
*H10N 30/00* (2023.01)
*H03H 9/58* (2006.01)
(Continued)

(52) U.S. Cl.
CPC ......... *H10N 30/708* (2024.05); *H10N 30/057* (2023.02); *H10N 30/076* (2023.02);
(Continued)

(58) Field of Classification Search
CPC .... H10N 30/057; H10N 30/079; H10N 30/50; H10N 30/076; H10N 30/708;
(Continued)

(56) References Cited

U.S. PATENT DOCUMENTS

2005/0029629 A1 2/2005 Noguchi et al.
2007/0057285 A1* 3/2007 Akiyama ................ C23C 14/06
257/E27.006
(Continued)

FOREIGN PATENT DOCUMENTS

CN 110832655 A 2/2020
JP 2005-56940 A 3/2005
(Continued)

OTHER PUBLICATIONS

International Search Report issued on Apr. 27, 2021, in connection with International Patent Application No. PCT/JP2021/010223 (5 pages); along with an English translation.
(Continued)

*Primary Examiner* — J. San Martin
(74) *Attorney, Agent, or Firm* — Hauptman Ham, LLP

(57) ABSTRACT

A multilayer structure and a piezoelectric device using the same, which have satisfactory crystal orientation even in the submicron region of the thickness of a piezoelectric layer, are provided. The multilayer structure includes a first wurtzite thin film, a first hexagonal metal layer, a first electrode layer, a second hexagonal metal layer, and a second wurtzite thin film stacked in this order. The first electrode layer is formed of a metallic material having an acoustic impedance higher than that of the second wurtzite thin film.

10 Claims, 6 Drawing Sheets

<u>110</u>

(51) Int. Cl.

| | |
|---|---|
| *H10N 30/057* | (2023.01) |
| *H10N 30/076* | (2023.01) |
| *H10N 30/079* | (2023.01) |
| *H10N 30/50* | (2023.01) |
| *H10N 30/87* | (2023.01) |

(52) U.S. Cl.
CPC ........... *H10N 30/079* (2023.02); *H10N 30/50* (2023.02); *H10N 30/8*77 (2023.02); *H03H 9/585* (2013.01)

(58) Field of Classification Search
CPC .... H10N 30/877; H10N 30/853; H03H 9/171; H03H 9/02157; H03H 3/02; H03H 9/02015; H03H 9/585
See application file for complete search history.

(56) References Cited

U.S. PATENT DOCUMENTS

| | | | |
|---|---|---|---|
| 2009/0045704 A1* | 2/2009 | Barber ................... | H03H 9/131 |
| | | | 29/25.35 |
| 2016/0109306 A1* | 4/2016 | Janssen .................... | G01L 1/16 |
| | | | 204/192.18 |
| 2020/0274052 A1 | 8/2020 | Kimura | |
| 2020/0357976 A1* | 11/2020 | Teshigahara ......... | H10N 30/708 |
| 2021/0343927 A1* | 11/2021 | Nagaoka .............. | H10N 30/079 |

FOREIGN PATENT DOCUMENTS

| | | |
|---|---|---|
| JP | 4117376 B2 | 5/2008 |
| JP | 2009-231981 A | 10/2009 |
| JP | 2012-116736 A | 6/2012 |
| WO | 2004/101842 A1 | 11/2004 |
| WO | 2019/163494 A1 | 8/2019 |

OTHER PUBLICATIONS

Written Opinion issued on Apr. 27, 2021, in connection with International Patent Application No. PCT/JP2021/010223 (4 pages).
The Extended European Search Report issued Apr. 5, 2024 for corresponding European Application No. 21775657.6 (9 pages).
Lanz, "Piezoelectric Thin Films for Bulk Acoustic Wave Resonator Applications: From Processing to Microwave Filters", École Polytechnique Fédérale De Lausanne, Thesis No. 2991, (2004) (201 pages).
Y.Q. Fu et al., "Advances in piezoelectric thin films for acoustic biosensors, acoustofluidics and lab-on-chip applications", Progress in Materials Science, vol. 89, Apr. 2017, pp. 31-91 (61 pages).
Office Action dated Jun. 6, 2025 for corresponding Chinese Patent Application No. 202180021031.3, along with an English machine translation (15 pages).
Office Action dated Oct. 15, 2024 for corresponding Japanese Patent Application No. 2020-156573, along with an English translation (10 pages).
Y. Yoshino et al., "Optimization of zinc oxide thin film for surface acoustic wave filters by radio frequency sputtering", Vacuum, vol. 59, 2000, Elsevier Science Ltd., pp. 538-545.
Office Action issued on Dec. 8, 2025, for corresponding Chinese Patent Application No. 202180021031.3., along with an English machine translation (14 pages).
Communication pursuant to Article 94(3) EPC dated Dec. 15, 2025 for corresponding European Patent Application No. 21775657.6 (6 pages).

* cited by examiner

$R_1 = T_1/Mo \;\; (1/10 \leq R_1 \leq 1/3)$

| SAMPLE NUMBER | Ti | Mo | Ti/Mo RATIO | FWHM |
|---|---|---|---|---|
| 11 | 30 | 300 | 1/10 | 3.3° |
| 12 | 30 | 90 | 1/3 | 2.8° |
| 13 | 30 | 200 | 3/20 | 2.7° |
| 14 | 25 | 100 | 1/4 | 3.3° |

FIG.6

$R_2 = (1^{st}\ ZnO)/IZO \;\; (1/5 \leq R_2 \leq 1/1)$

| SAMPLE NUMBER | ZnO | IZO | ZnO/IZO RATIO | FWHM |
|---|---|---|---|---|
| 21 | 30 | 50 | 3/5 | 3.3° |
| 22 | 50 | 50 | 1/1 | 4.0° |
| 23 | 30 | 100 | 3/10 | 2.5° |
| 24 | 20 | 100 | 1/5 | 2.5° |

FIG.7

$R_3 = (1^{st}\ ZnO)/(2^{nd}\ ZnO)\ (1/40 \leq R_3 \leq 1/3)$

| SAMPLE NUMBER | $1^{st}$ ZnO | $2^{nd}$ ZnO | $(1^{st}\ ZnO)/$ $(2^{nd}\ ZnO)$ RATIO | FWHM |
|---|---|---|---|---|
| 31 | 30 | 200 | 3/20 | 3.3° |
| 32 | 30 | 900 | 1/30 | 2.5° |
| 33 | 50 | 150 | 1/3 | 4.2° |
| 34 | 30 | 120 | 1/4 | 2.7° |

MULTILAYER STRUCTURE, PIEZOELECTRIC DEVICE USING THE SAME, MANUFACTURING METHOD OF MULTILAYER STRUCTURE, AND MANUFACTURING METHOD OF PIEZOELECTRIC DEVICE

CROSS-REFERENCE TO RELATED APPLICATIONS

This application is a National Stage of International Application No. PCT/JP2021/010223, filed on Mar. 12, 2021, which designates the United States and was published in Japan, and which is based upon and claims priorities to Japanese Patent Application No. 2020-052354 filed on Mar. 24, 2020, and Japanese Patent Application No. 2020-156573 filed on Sep. 17, 2020, in the Japan Patent Office. All of the aforementioned applications are hereby incorporated by reference in their entireties.

TECHNICAL FIELD

The present invention relates to a multilayer structure, a piezoelectric device using the same, and manufacturing methods of these, and more particularly to a thin-film multilayer structure and a piezoelectric device for high-frequency operation.

BACKGROUND ART

Conventionally, piezoelectric devices making use of the piezoelectric effect of materials have been used. The piezoelectric effect is a phenomenon in which polarization is induced in a material in proportion to a pressure or a mechanical force applied onto the material. Various types of sensors, including pressure sensors, acceleration sensors, and acoustic emission (AE) sensors for detecting elastic waves, have been fabricated using the piezoelectric effect.

In recent years, wurtzite piezoelectric thin films have been applied to bulk acoustic wave (BAW) filters, which are used as high-frequency bandpass noise filters for smartphones. The fundamental property of the BAW filter is a vibration in the thickness direction of the piezoelectric thin film (thickness vibration mode), and therefore, a piezoelectric film needs to have a highly oriented crystal structure whose crystal axis is oriented in a uniform direction.

The BAW filter is configured to confine the vibrating energy within the piezoelectric thin film to improve the characteristics. Accordingly, a heavy metal with a high density and a high Young's modulus is used for the electrodes to achieve a high acoustic impedance.

However, in general, lattice matching is insufficient between a wurtzite thin film and a high acoustic impedance metal, and the crystal orientation of the wurtzite piezoelectric thin film tends to be disordered.

A configuration to solve this problem has been proposed, in which a first wurtzite piezoelectric thin film, a functional material layer serving as an electrode, and a second wurtzite piezoelectric thin film are formed in this order on a substrate. See, for example, Patent Document 1 presented below. The proposed multilayer structure enhances the lattice matching between the functional material layer and the second wurtzite piezoelectric thin film, and improves the crystal orientation of the second wurtzite piezoelectric thin film.

RELATED ART DOCUMENT(S)

Patent Document 1: Japan Patent No. 4,117,376

SUMMARY OF THE INVENTION

Technical Problem to be Solved

In anticipation of the Fifth Generation (5G) mobile communications using the sub-6 GHz band and millimeter wave band, high-frequency devices, typified by BAW filters, are required to operate at even higher frequencies. With a piezoelectric thin film, the drive frequency is determined by the thickness of the piezoelectric thin film, as the working principle. In order to achieve high frequencies in the sub-6 GHz or higher frequency band, superior crystal orientation is needed for an ultra-thin film with a thickness of several hundred nanometers.

In the related art document presented above, the first wurtzite piezoelectric thin film is provided under the functional material layer for the purpose of enhancing the lattice matching between the functional material layer serving as an electrode and the second wurtzite piezoelectric thin film. However, this configuration cannot achieve sufficient lattice matching because of the significant difference in the basic crystal structure between the functional material layer and the wurtzite piezoelectric layer. The related art technique is not regarded as technique that provides a satisfactory growth mechanism close to epitaxial growth conferring good crystal orientation.

In general, it is said that the greater the film thickness in thin film growth, the smaller the effect of the initial crystal disorder and the better the crystal orientation, even if the crystal orientation is initially disordered. In the above-described related art document, the second wurtzite piezoelectric thin film has a thickness of 1 μm, and therefore, it is considered that the crystal orientation is improved to some extent.

However, if the thickness of the second wurtzite piezoelectric thin film is reduced in order to deal with higher frequencies, the influence of the initial crystal disorder will increase, and it will be difficult to achieve satisfactory crystal orientation suitable for high frequency devices.

The present invention has been conceived in view of the above-described technical problems, and aims to provide a piezoelectric device having satisfactory crystal orientation even in the submicron region of the thickness of the piezoelectric layer.

Technical Solution(s)

In an embodiment, crystal growth is promoted by providing an orientation control layer to adjust the matching degree of crystal growth between stacked layers, thereby achieving a piezoelectric device using a wurtzite piezoelectric thin film having crystal orientation close to that of an epitaxial layer.

In one aspect of the present disclosure, a piezoelectric device includes a first wurtzite thin film, a first hexagonal metal layer, a first electrode layer, a second hexagonal metal layer, and a second wurtzite thin film which are stacked in this order. The first electrode layer is formed of a metallic material having an acoustic impedance higher than that of the second wurtzite thin film.

Advantageous Effect of the Invention

With the above-noted configuration, a piezoelectric device having good crystal orientation even in the submicron region of the thickness of the piezoelectric layer can be achieved.

BRIEF DESCRIPTION OF DRAWINGS

FIG. 5 shows some examples of a film thickness ratio R1 between the hexagonal metal layer and the first electrode, and the degree of crystal orientation;

FIG. 6 shows some examples of a film thickness ratio R2 between the first wurtzite thin film and the amorphous layer, and the degree of crystal orientation; and FIG. 7 shows some examples of a film thickness ratio R3 between the first wurtzite thin film and a second wurtzite thin film, and the degree of crystal orientation.

EMBODIMENT(S) FOR IMPLEMENTING THE INVENTION

In the embodiment, a piezoelectric layer, which is a functional layer, is formed of a wurtzite thin film with a thickness of less than 1000 nm (submicron), preferably several hundred nanometers, in order to achieve a high-frequency piezoelectric device. To efficiently confine the vibration energy within the thin piezoelectric layer, a metal with a higher acoustic impedance than the piezoelectric layer is used as an electrode. Due to the difference in acoustic impedance, the acoustic wave is reflected at the interface between the electrode and the piezoelectric layer, and the vibration energy is confined in the piezoelectric layer.

Acoustic impedance is expressed as the product of density and acoustic velocity. The speed of sound correlates with the elastic modulus of a substance, and a substance having a higher the elastic modulus has a higher acoustic velocity. A high acoustic impedance of the electrode means that at least one of the density and Young's modulus of the electrode material is high. Dense (heavy) metals have a high conversion efficiency between electrical and acoustic energy when the Young's modulus is high.

On the other hand, as will be described later, the crystal orientation of the piezoelectric layer affects the conversion efficiency between electrical energy and acoustic energy. The better the crystal orientation of the piezoelectric layer, the higher the energy conversion efficiency.

In order to grow a wurtzite thin film as a piezoelectric layer on the electrode with good crystal orientation, another wurtzite thin film is inserted as a base for the electrode. Furthermore, a hexagonal metal layer having the same crystal structure as wurtzite is provided between the underlying wurtzite thin film and the electrode, and between the electrode and the upper wurtzite thin film serving as the piezoelectric function layer.

In a preferred configuration example, an amorphous orientation control layer may be used in combination with the underlying wurtzite thin film and the hexagonal metal layer in order to improve the crystal orientation.

With this configuration, the crystal conformation is regulated between adjacent layers in the stacking direction, and crystal growth close to epitaxial growth is achieved. The piezoelectric layer formed on the electrodes has good crystal orientation even with a submicron thickness, for example, several hundred nanometers.

[EXAMPLES OF MULTILAYER STRUCTURE AND PIEZOELECTRIC DEVICE]

Figure 1A:
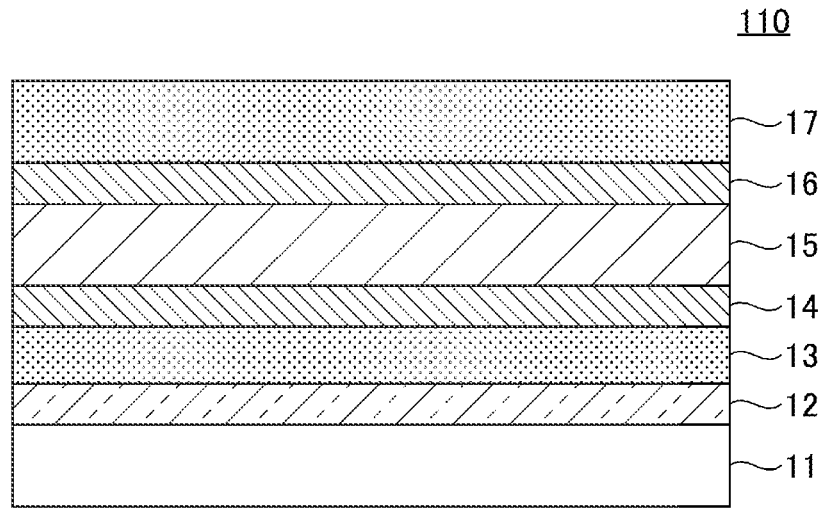
FIG. 1A shows a first example of the configuration of a multilayer structure according to an embodiment.

FIG. 1A is a schematic diagram of a multilayer structure 110 of an embodiment. The multilayer structure 110 has an amorphous layer 12, a first wurtzite thin film 13, a first hexagonal metal layer 14, a first electrode layer 15, a second hexagonal metal layer 16, and a second wurtzite thin film 17 in this order on a substrate 11. In this specification, terms such as "upper", "lower", "upper layer", and "lower layer" do not intend to represent an absolute positional relationships, but represent the relative position in the stacking direction to facilitate understanding of the invention.

The type of the substrate 11 is not limited, and an appropriate material such as a silicon (Si) substrate, a glass substrate, or a plastic substrates can be used. When a plastic substrate is used, it may be a flexible substrate that can impart flexibility to the device.

As the plastic substrate, for example, polyethylene terephthalate (PET), polyethylene naphthalate (PEN), polycarbonate (PC), acrylic resin, cycloolefin polymer, polyimide (PI), or the like can be used. When the piezoelectric device 10 is applied to a BAW filter, a part of the substrate 11 may be processed into a diaphragm.

The amorphous layer 12 may be omitted if the first wurtzite thin film 13 can grow with good crystal orientation on the surface of the substrate 11. By inserting the amorphous layer 12, the crystal orientation of the entirety of the multilayer structure can be improved. By using an inorganic material for the amorphous layer 12, any material that can improve the wettability between the substrate 11 and the first wurtzite thin film 13 and the crystal orientation of the first wurtzite thin film 13 can be used. As the inorganic amorphous layer 12, indium tin oxide (ITO), indium zinc oxide (IZO), indium zinc tin oxide (IZTO), indium gallium zinc oxide (IGZO), or the like can be used. Alternatively, ZnO to which $Al_2O_3$ and $SiO_x$ are added (hereinafter referred to as "SAZO"), $Al_2O_3$, or $SiO_x$ may be used.

An organic material can also be used for the amorphous layer 12 as long as it improves the crystal orientation of the first wurtzite thin film 13. Examples of the organic material 12 include, but are not limited to an acrylic resin, a urethane resin, a melamine resin, an alkyd resin, and a siloxane-based polymer.

The amorphous layer 12 may be a single layer, or a multilayer including two or more amorphous layers. In the latter case, an inorganic amorphous layer and an organic amorphous layer may be laminated.

Although the film thickness of the amorphous layer 12 is not particularly limited, it is preferably 3 nm to 100 nm, and more preferably 10 nm to 50 nm. When the thickness of the amorphous layer 12 is less than 3 nm, it may be difficult for the amorphous layer 12 to exhibit the function of orientation controllability. With the thickness of the amorphous layer 12 exceeding 100 nm, it may be difficult to make the entity of the device thinner.

The first wurtzite thin film 13 is provided to improve the crystal orientation of the second wurtzite thin film 17. The first hexagonal metal layer 14, the first electrode layer 15, and the second hexagonal metal layer 16 formed on the first wurtzite thin film 13 are affected by the crystal orientation of the first wurtzite thin film 13. The difference in the basic crystal structure between the first electrode layer 15 and the second wurtzite thin film 17 is relaxed, and the second wurtzite thin film 17 is grown on the electrode structure including the first electrode layer 15 with good crystal orientation.

The first wurtzite thin film 13 may contain, as a main component, one or more compounds selected from zinc oxide (ZnO), aluminum nitride (AlN), gallium nitride (GaN), and indium nitride (InN). The first wurtzite thin film 13, and the second wurtzite thin film 17 which serves as the piezoelectric layer may be formed of the same material or different materials. It is desirable that the first wurtzite thin film 13 and the second wurtzite thin film 17 contain the same compound as the main component, from the viewpoint of matching of the crystal lattice and simplicity of the manufacturing process.

The thickness of the first wurtzite thin film 13 is preferably 5 nm to 50 nm, more preferably 10 nm to 30 nm. If the film thickness exceeds 50 nm, it approaches the thickness of the second wurtzite thin film 17 serving as the functional layer, and unnecessary vibration such as multiple resonance will be induced. If the film thickness is less than 5 nm, it is difficult to sufficiently transfer the c-axis orientation of the first wurtzite thin film 13 to the upper layer.

The film thickness of the second wurtzite thin film 17 is not particularly limited because the optimum value changes depending on the target resonance frequency. If the target resonance frequency is 6 to 10 GHz, the thickness is desirably 300 nm or less. With the target resonance frequency of higher than 10 GHz, the thickness is desirably 200 nm or less.

The first hexagonal metal layer 14 and the second hexagonal metal layer 16 function as orientation control layers. Any hexagonal metal having the same lattice structure as wurtzite can be used. Examples of such hexagonal metal include, but are not limited to titanium (Ti), zirconium (Zr), hafnium (Hf), ruthenium (Ru), zinc (Zn), yttrium (Y), scandium (Sc), and combinations thereof.

Since the first hexagonal metal layer 14 and the second hexagonal metal layer 16 function as orientation control layers for regulating lattice matching, it is desirable that the first hexagonal metal layer 14 and the second hexagonal metal layer 16 contain the same material as the main component.

The thicknesses of the first hexagonal metal layer 14 and the second hexagonal metal layer 16 are preferably 5 nm to 50 nm, and more preferably 10 nm to 30 nm. If the thickness is less than 5 nm, it is difficult to sufficiently exhibit the function of regulating the lattice matching. With the film thickness exceeding 50 nm, it approaches the thickness of the first electrode layer 15, and the first hexagonal metal layer 14 and the second hexagonal metal layer 16, which are orientation control layers, may disadvantageously behave as if they were electrodes.

The material of the first electrode layer 15 is not limited as long as it has an acoustic impedance higher than that of the second wurtzite thin film 17. As noted above, a high density, high Young's modulus materials is desirable to have a high acoustic impedance. Examples of the material with a high acoustic impedance and high Young's modulus include, but are not limited to molybdenum (Mo), tungsten (W), ruthenium (Ru), rhodium (Rh), titanium (Ti), and hafnium (Hf).

The film thickness of the first electrode layer 15 is not particularly limited because the optimum value changes depending on the target resonance frequency. The first electrode layer 15 may be formed of the same material as the first hexagonal metal layer 14 and/or the second hexagonal metal layer 16 to form a single hexagonal electrode layer.

The second wurtzite thin film 17 preferably contains one or more compounds selected from ZnO, AlN, GaN, and InN as the main component, similarly to the first wurtzite thin film 13.

As described above, the film thickness of the second wurtzite thin film 17 is not particularly limited because the optimum value varies depending on the target resonance frequency. For use in the sub-6 GHz band, the thickness of the second wurtzite thin film 17 is desirably 300 nm or less. Since the stack of the amorphous layer 12, the first wurtzite thin film 13, and the first hexagonal metal layer 14 is provided as the underlayer, the second wurtzite thin film 17 has good crystal orientation even if the thickness is 300 nm or less. The second wurtzite thin film 17 has good vibration characteristics in the film thickness direction.

Figure 1B:
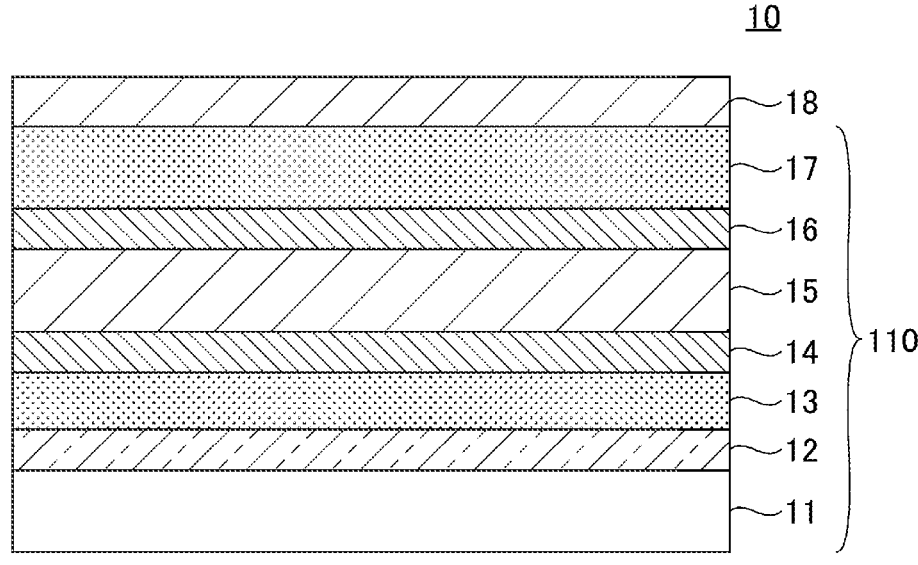
FIG. 1B is a schematic diagram of a piezoelectric device using the multilayer structure of FIG. 1A.

FIG. 1B is a schematic diagram of a piezoelectric device 10 using the multilayer structure 110 shown in FIG. 1A. The piezoelectric device 10 has a second electrode layer 18 on the second wurtzite thin film 17 of the multilayer structure 110. The second wurtzite thin film 17 produces an electrical signal corresponding to the oscillation of the electric field applied between the first electrode layer 15 and the second electrode layer 18.

The material of the second electrode layer 18 is not limited as long as it is a conductor such as a metal. From the viewpoint of improving the vibration energy confining effect, a metal having an acoustic impedance higher than that of the second wurtzite thin film 17 is desirable. Examples of such a metal include, but are not limited to molybdenum (Mo), tungsten (W), ruthenium (Ru), rhodium (Rh), titanium (Ti), and hafnium (Hf).

Figure 2A:
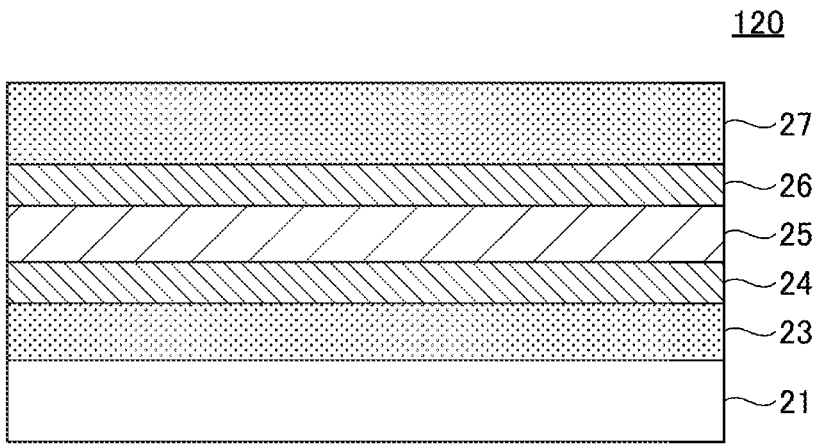
FIG. 2A shows a second example of the configuration of the multilayer structure according to an embodiment.

FIG. 2A is a schematic diagram of a multilayer structure 120 according to an embodiment. The multilayer structure 120 has the similar layered structure to that of the multilayer structure 110 of FIG. 1A, except that the amorphous layer 12 is not used. The multilayer structure 120 has a first wurtzite thin film 23, a first hexagonal metal layer 24, a first electrode layer 25, a second hexagonal metal layer 26, and second wurtzite thin film 27 in this order on a substrate 21. Even without the amorphous layer, the lattice structure of the first wurtzite thin film 23 can be reflected into the first electrode layer 25 through the first wurtzite thin film 23 and the first hexagonal metal layer 24, and the crystal orientation of the second wurtzite thin film 27 can be improved.

Figure 2B:
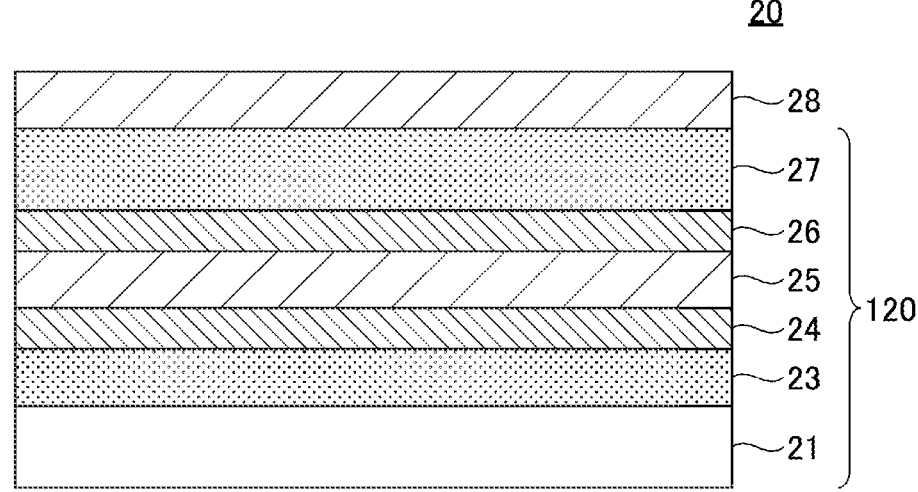
FIG. 2B is a schematic diagram of a piezoelectric device using the multilayer structure of FIG. 2A.

FIG. 2B is a schematic diagram of a piezoelectric device 20 using the multilayer structure 120 of FIG. 2A. The piezoelectric device 20 has a second electrode layer 28 on the second wurtzite thin film 27 of the multilayer structure 120. The material of the second electrode layer 28 is not limited as long as it is a conductor such a metal. From the viewpoint of improving the vibration energy confining effect, it is desirable that the second electrode layer 28 has an acoustic impedance higher than that of the second wurtzite thin film 27. The second wurtzite thin film 27 produces an electrical signal corresponding to the oscillation of the electric field applied between the first electrode layer 25 and the second electrode layer 28.

<Evaluation of Piezoelectric Devices>

Figure 3:
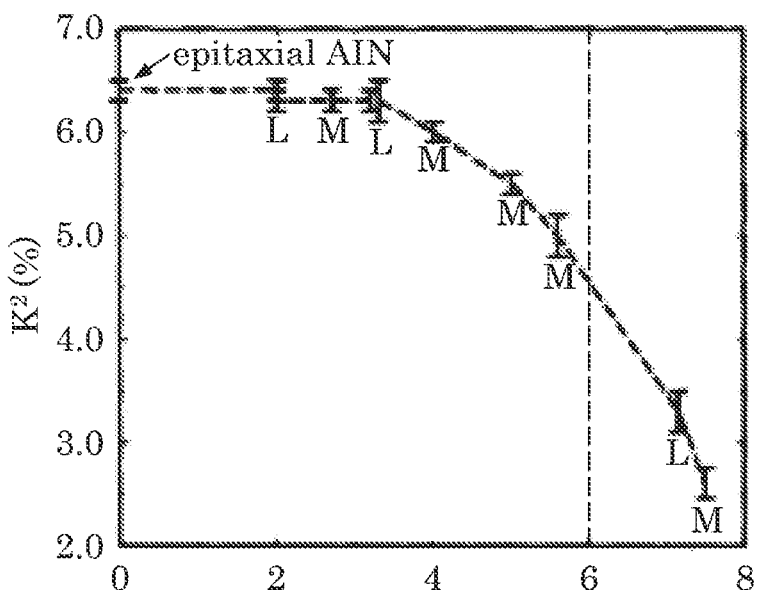
FIG. 3 is a diagram showing the relationship between the degree of crystal orientation and the electromechanical coupling coefficient.

FIG. 3 shows a known relationship between the degree of crystal orientation and the electromechanical coupling coefficient. This chart is disclosed in R. S. Naik, et al., IEEE TUFFC, 47, (2000) 292.

The degree of crystal orientation on the horizontal axis is indicated by a full width at half maximum (FWHM) of the peak waveform of the reflection from the sample surface measured by the X-ray rocking curve method. The smaller the FWHM of the X-ray rocking curve, the better the crystal orientation of the piezoelectric material.

In the case of a wurtzite crystal, the FWHM of an X-ray rocking curve obtained by measuring reflection from the (0002) plane of the crystal indicates the degree of parallelism of microscopic crystal axes in the c-axis direction. The smaller the FWHM of the X-ray rocking curve, the better the c-axis orientation of the crystal.

The $k^2$ value on the vertical axis represents the electromechanical coupling coefficient. The electromechanical coupling coefficient indicates the energy conversion efficiency between electrical energy and acoustic energy determined for a piezoelectric body. The higher the energy conversion efficiency between electrical energy and acoustic energy, the better the working efficiency as a piezoelectric device.

In order to allow the device to properly function as a piezoelectric device in higher frequency band, it is desirable that the FWHM of the X-ray rocking curve of the second wurtzite thin film 17 is 6° or less. Among piezoelectric devices, for applications to high-frequency devices such as BAW filters, the FWHM of the X-ray rocking curve is desirably 4° or less at which the electromechanical coupling coefficient starts to saturate.

Evaluation is made below to determine a desirable device configuration that can achieve good piezoelectric characteristics. A plurality of samples are prepared with different configurations to measure and evaluate FWHMs by the X-ray rocking curve method.

Figure 4:
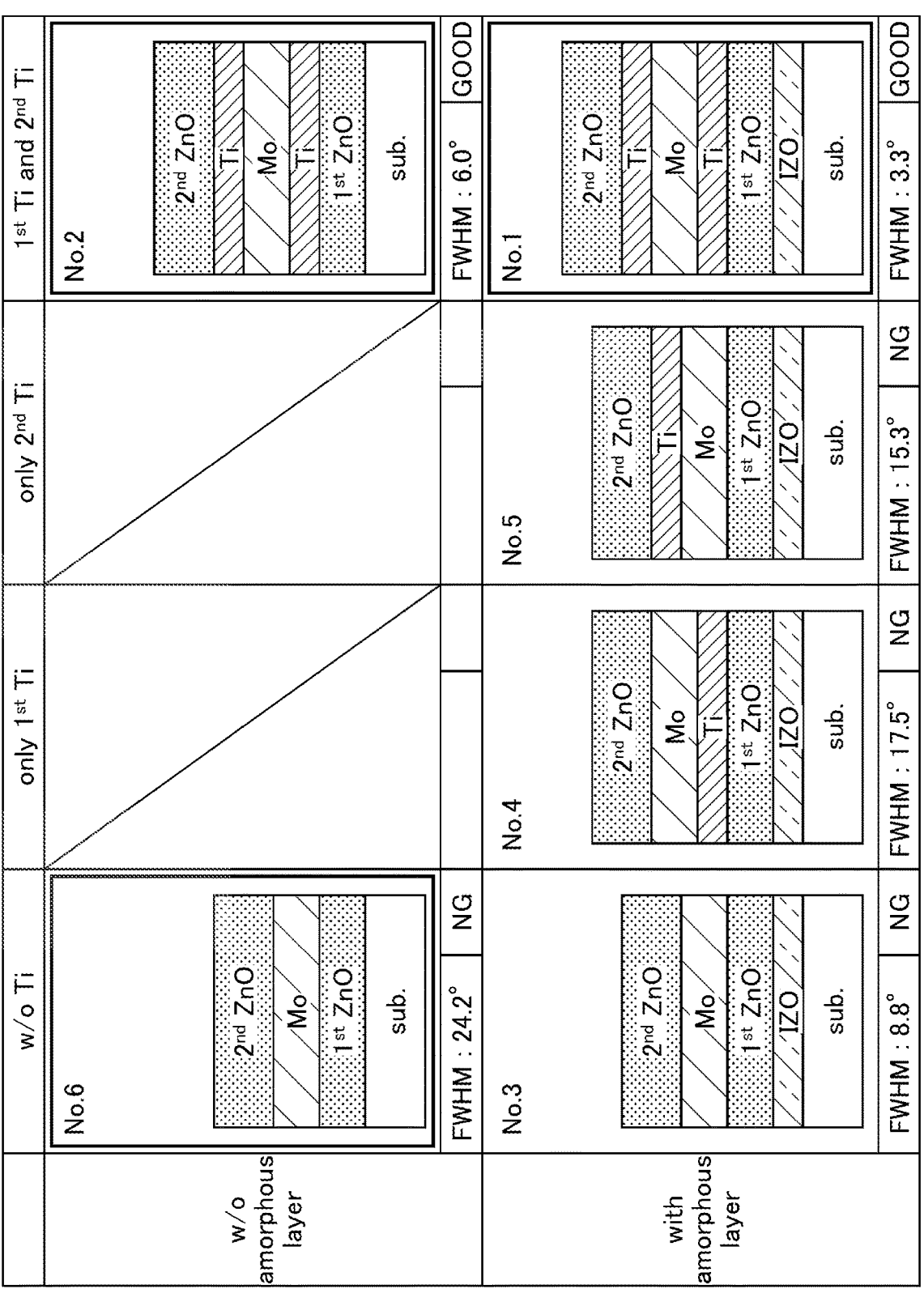
FIG. 4 shows crystal orientations in the respective configurations.

FIG. 4 shows the evaluation results of the samples. As configuration parameters, the vertically divided sections indicate the presence or absence of the amorphous layer 12, and the horizontally divided sections indicate the presence or absence of the first hexagonal metal layer 14 and the second hexagonal metal layer 16. The samples are fabricated under the same conditions except for the presence or absence of the amorphous layer 12, the first hexagonal metal layer 14, and the second hexagonal metal layer 16.

<Sample No. 1>

Sample no. 1 has the same multilayer structure as the piezoelectric device 10 of the embodiment shown in FIG. 1. An IZO layer having a thickness of 50 nm is formed as an amorphous layer by DC magnetron sputtering on a alkali-free glass substrate. A ZnO layer with a thickness of 30 nm is formed as the first wurtzite thin film by RF magnetron sputtering. A Ti layer with a thickness of 30 nm serving as the first hexagonal metal layer, a Mo layer with a thickness of 300 nm serving as the first electrode layer, and another Ti layer with a thickness of 30 nm serving as the second hexagonal metal layer are formed in this order by DC magnetron sputtering. Then, a ZnO layer with a thickness of 200 nm is deposited as the second wurtzite thin film by RF magnetron sputtering. The thickness of 200 nm of the ZnO layer corresponds to a resonance frequency of about 15 GHz. All of the above film deposition processes are performed without heating.

Reflection from the (0002) plane of the second ZnO thin film is observed by X-ray rocking curve measurement, and FWHM is calculated from the peak. The FWHM of the measurement result is 3.3°.

This FWHM value falls within the range of 6° or less of the characteristic curve of FIG. 3, and further within the range of 4° or less suitable for a BAW filter. The characteristics of Sample No. 1 are satisfactory, and are evaluated as "GOOD" in FIG. 4.

<Sample No. 2>

Sample No. 2 has the same multilayer structure as the piezoelectric device 20 of the embodiment shown in FIG. 2, and does not have an amorphous layer.

A ZnO layer with a thickness of 30 nm is formed as a first wurtzite thin film on an alkali-free glass substrate by RF magnetron sputtering. A Ti layer with a thickness of 30 nm serving as the first hexagonal metal layer, a Mo layer with a thickness of 300 nm serving as the first electrode layer, and another Ti layer with a thickness of 30 nm serving as the second hexagonal metal layer are formed in this order by DC magnetron sputtering. Then, a ZnO layer with a thickness of 200 nm is formed as the second wurtzite thin film by RF magnetron sputtering. All of the above film deposition processes are performed without heating.

By measurement of X-ray rocking curves, the reflection from the (0002) plane of the second ZnO thin film is observed, and FWHM is calculated from the peak. The FWHM value of the measurement result is 6.0°. This FWHM value falls within the range of 6° or less of the characteristic curve of FIG. 3, and this sample can operate as a high-frequency piezoelectric device. The characteristics of Sample No. 2 are also satisfactory, and are evaluated as "GOOD" in FIG. 4

<Sample No. 3>

Sample No. 3 has an amorphous layer, while it has neither a first hexagonal metal layer nor a second hexagonal metal layer.

An IZO layer with a thickness of 50 nm is formed as the amorphous layer on an alkali-free glass substrate by DC magnetron sputtering. A ZnO layer (first ZnO) having a thickness of 30 nm is formed as a first wurtzite thin film on the IZO layer by RF magnetron sputtering.

A Mo layer with a thickness of 300 nm is formed as the first electrode layer on the first ZnO by DC magnetron sputtering. Then, a 200 nm-thick ZnO layer is formed as a second wurtzite thin film on the surface of the Mo electrode by RF magnetron sputtering. All of the above film formations are performed without heating.

By measurement of X-ray rocking curves, the reflection from the (0002) plane of the second ZnO thin film is observed, and FWHM is calculated from the peak. The FWHM value of the measurement result is 8.8°. This FWHM value is greater than 6° in the characteristic curve of FIG. 3, and the crystal orientation is insufficient for a high-frequency piezoelectric device having a piezoelectric functional layer of several hundred nanometer thickness. The characteristics of Sample No. 3 are unsatisfactory, and are evaluated as "not good" which is abbreviated as "NG" in FIG. 4.

<Sample No. 4>

Sample No. 4 has an amorphous layer and a first hexagonal metal layer, but does not have a second hexagonal metal layer.

An IZO layer with a thickness of 50 nm is formed as an amorphous layer on an alkali-free glass substrate by DC magnetron sputtering. A ZnO layer (first ZnO) having a thickness of 30 nm is formed as a first wurtzite thin film on the IZO layer by RF magnetron sputtering. A Ti layer with a thickness of 30 nm serving as the first hexagonal metal layer, and a Mo layer with a thickness of 300 nm serving as the first electrode layer are formed in this order on the first ZnO layer by DC magnetron sputtering. A 200 nm-thick ZnO layer is formed as a second wurtzite thin film on the surface of the Mo electrode by RF magnetron sputtering. All of the above film deposition processes are performed without heating.

By measurement of X-ray rocking curves, the reflection from the (0002) plane of the second ZnO thin film is observed, and FWHM is calculated from the peak. The FWHM value of the measurement result is 17.5°. This FWHM value is far from the range of 6° or less of the characteristic curve in FIG. 3. It is difficult for this sample configuration to operate as a piezoelectric device. The characteristics of Sample No. 4 are unsatisfactory, and are evaluated as "not good" (abbreviated as "NG" in FIG. 4).

In spite of the fact that the amorphous IZO layer is used in Sample No. 4, the FWHM is unsatisfactory. The reason for this may be because the crystal lattice of the Mo layer has distorted due to the Ti layer inserted between the first ZnO layer and the Mo electrode, and because the second ZnO layer is formed on the MO layer in a state that the lattice distortion or strain has not been recovered.

<Sample No. 5>

Sample No. 5 has an amorphous layer and a second hexagonal metal layer, but does not have a first hexagonal metal layer.

An IZO layer with a thickness of 50 nm is formed as an amorphous layer on an alkali-free glass substrate by DC magnetron sputtering. A ZnO layer (first ZnO) having a thickness of 30 nm is formed as a first wurtzite thin film on the IZO layer by RF magnetron sputtering. On the first ZnO, a 300 nm-thick Mo layer serving as a first electrode layer, and a 30 nm-thick Ti layer serving as a second hexagonal metal layer are formed in this order by DC magnetron sputtering. Then, a 200 nm-thick ZnO layer is formed as a second wurtzite thin film on the Ti layer by RF magnetron sputtering. All of the above film deposition processes are performed without heating.

By measurement of X-ray rocking curves, reflection from the (0002) plane of the second ZnO thin film is observed, and FWHM is calculated from the peak. The FWHM value of the measurement result is 15.3°. This FWHM value is far from the range of 6° or less of the characteristic curve in FIG. 3, and it is difficult for this sample configuration to operate as a piezoelectric device. The characteristics of Sample No. 5 are unsatisfactory, and are evaluated as "not good" (abbreviated as "NG" in FIG. 4).

In spite of the fact that the IZO amorphous layer is used in Sample No. 5, FWHM is unsatisfactory. The reason for this may be because the crystal lattice of the Mo electrode, which has taken over the crystal lattice of the first ZnO, is distorted by the Ti layer inserted between the Mo electrode and the second ZnO, and because the second ZnO is formed in the state where the distortion or strain exists in the underlayer.

<Sample No. 6>

Sample No. 6 is a referenced example, and has the configuration disclosed in the related art document. Neither amorphous layers nor hexagonal metal layer is used in this sample. Although the layered configuration is one disclosed in the related art document, the conditions of film deposition for the respective layers are the same as those for Sample No. 1 to Sample No. 5.

A ZnO layer (first ZnO) with a thickness of 30 nm is formed as a first wurtzite thin film on an alkali-free glass substrate by RF magnetron sputtering. A 300 nm-thick Mo layer is formed as a first electrode on the first ZnO by DC magnetron sputtering. A 200 nm-thick ZnO layer is formed as a second wurtzite thin film on the Mo electrode by RF magnetron sputtering. All of the above film deposition processes are performed without heating.

Although the AlN layer of the related art document formed as the second wurtzite crystal layer has a thickness of 1 μm, the thickness of the second ZnO of Sample No. 6 is set to 200 nm, as in the other samples, assuming an application to a high-frequency device.

By measurement of X-ray rocking curves, reflection from the (0002) plane of the second ZnO thin film is observed, and FWHM is calculated from the peak. The FWHM value of the measurement result is 24.2°. This FWHM value is much further away from the range of 6° or less of the characteristic curve in FIG. 3, even compared with Sample No. 4 and Sample No. 5. The characteristics of No. 6 are poor, and are evaluated as "not good" (abbreviated as "NG" in FIG. 4).

In the related art document, the crystal orientation disorder of the initial stage of the crystal growth is recovered by increasing the thickness of the second wurtzite crystal layer up to 1 μm. However, with the film thickness of 200 nm of the second wurtzite crystal layer as in Sample No. 6, the crystal orientation disorder is not recovered.

It is understood from the results of FIG. 4 that the crystal orientation is improved by sandwiching the high acoustic impedance electrode (of a heavy metal) by hexagonal metal layers from the top and the bottom, and that the crystal orientation of the wurtzite thin film is further improved by providing an amorphous layer as the orientation control layer.

<Consideration on Film Thickness>

FIG. 5 shows the film thickness ratio R1 between the first hexagonal metal layer 14 (or 24) and the first electrode layer 15 (or 25), and the degree of crystal orientation. Ti is used as the first hexagonal metal, and Mo is used as the first electrode. For Sample numbers 11 to 14, the Ti/Mo ratio (R1) is varied, and FWHM of the X-ray rocking curve measurement is calculated.

In Sample No. 11, the film thickness of Ti is 30 nm and the film thickness of Mo is 300 nm. The Ti/Mo ratio is 1/10. The FWHM of the X-ray rocking curve of this sample is 3.3°, which is satisfactory.

In Sample Nos. 12 and 13, the film thickness of Ti is 30 nm as in Sample No. 11, but the film thickness of Mo is changed to 90 nm and 200 nm, respectively. The Ti/Mo ratio of Sample No. 12 is 1/3, and the FWHM of the X-ray rocking curve is 2.8°, which is satisfactory. The Ti/Mo ratio of Sample No. 13 is 3/20, and the FWHM of the X-ray rocking curve is 2.7°, which is satisfactory.

In Sample No. 14, the film thickness of Ti is set to 25 nm, and the film thickness of Mo is set to 100 nm. The Ti/Mo ratio of sample number 14 is 1/4, and the FWHM of the X-ray rocking curve is 3.3°, which is satisfactory.

In Sample Nos. 11 to 14, the range of Ti/Mo ratio is 1/10 to 1/3. By setting the thickness ratio R1 in this range, the crystal orientation of the upper (i.e., the second) wurtzite thin films 17 and 27 is improved. With the Ti/Mo ratio of 1/10 to 1/3, the FWHM of the X-ray rocking curve can be reduced to 3.3° or less, and the device can appropriately operate as a high frequency device such as a BAW filter. Focusing on Sample Nos. 12 and 14, the total thickness of the first hexagonal metal layer 14 (or 24) and the first electrode layer 15 (or 25) is reduced to about 120 nm. These samples can improve the crystal orientation of the upper functional layer, while reducing the total thickness of the device. Focusing on Sample Nos. 11 and 13, the high acoustic impedance Mo layer can be formed several hundred nanometer thick. The vibration energy can be sufficiently confined, and simultaneously, the crystal orientation of the upper functional layer is improved.

The evaluation results of FIG. 5 also apply to the film thickness ratio between the second hexagonal metal layer 16 (or 26) and the first electrode layer 15 (or 25) because of the symmetry of the layered structure. The layered structure including the first wurtzite thin film, the first hexagonal metal layer, the first electrode layer, the second hexagonal metal layer, and the second wurtzite thin film in this order is symmetrical in the stacking direction, with respect to the first electrode layer positioned at the center. Accordingly, in the X-ray rocking curve measurement on the surface of the first wurtzite thin film, measurement results similar to FIG. 5 will be obtained.

FIG. 6 shows the film thickness ratio R2 between the first wurtzite thin film 13 (or 23) and the amorphous layer 12, and the degree of crystal orientation. ZnO is used as the first wurtzite thin film 13 or 23, and IZO is used as the amorphous layer. The FWHM of X-ray rocking curve measurement is calculated, while changing the ZnO/IZO ratio (R2) among Sample numbers 21-24.

In Sample No. 21, the film thickness of ZnO is 30 nm, and the film thickness of IZO is 50 nm. The ZnO/IZO ratio is $3/5$. The FWHM of the X-ray rocking curve of this sample is 3.3°, which is satisfactory.

In Sample No. 22, the film thickness of IZO is 50 nm, and the film thickness of ZnO is 50 nm. The ZnO/IZO ratio is $1/1$. The FWHM of the X-ray rocking curve is 4.00, which is satisfactory.

In Sample No. 23, the film thickness of ZnO is 30 nm, and the film thickness of IZO is 100 nm. The ZnO/IZO ratio is $3/10$. The FWHM of the X-ray rocking curve is 2.5°, which is satisfactory.

In Sample No. 24, the film thickness of ZnO is 20 nm, and the film thickness of IZO is 100 nm. The ZnO/IZO ratio is $1/5$. The FWHM of the X-ray rocking curve is 2.5°, which is satisfactory.

In Sample Nos. 21 to 24, the ZnO/IZO ratio ranges from $1/5$ to $1/1$. By setting the film thickness ratio R2 within this range, the crystal orientation of the upper (i.e., the second) wurtzite thin films 17 and 27 is improved. Within this R2 range, the FWHM of the X-ray rocking curve is 4.0° or less, and therefore, the device can properly operate as a BAW filter.

FIG. 7 shows the thickness ratio R3 between the first wurtzite thin film 13 (or 23) and the second wurtzite thin film 17 (or 27), and the degree of crystal orientation. ZnO is used as the first wurtzite thin film and the second wurtzite thin film. For Sample Nos. 31 to 34, FWHMs of the X-ray rocking curves are measured, while changing the ratio R3 of the first ZnO thickness to the second ZnO thickness (denoted as "($1^{st}$ ZnO)/($2^{nd}$ ZnO) ratio" in the figure) among the samples.

In Sample No. 31, the film thickness of the first ZnO is 30 nm, and the film thickness of the second ZnO is 200 nm. The film thickness ratio of the first ZnO to the second ZnO is $3/20$. The FWHM of the X-ray rocking curve of this sample is 3.3°, which is satisfactory.

In Sample No. 32, the film thickness of the first ZnO is 30 nm, and the film thickness of the second ZnO is 900 nm. The film thickness ratio of the first ZnO to second ZnO is $1/30$. By increasing the film thickness of the second ZnO to 900 nm, the crystal lattice is well-ordered, and the FWHM of the X-ray rocking curve is improved to 2.5°.

In Sample No. 33, the film thickness of the first ZnO is 50 nm, and the film thickness of the second ZnO is 150 nm. The thickness ratio of the first ZnO to the second ZnO ratio is $1/3$. The FWHM of the X-ray rocking curve is 4.2°. This FWHM value is sufficiently good for a high frequency piezoelectric device, suggesting the possibility of application to BAW filters or other radio-frequency devices.

In Sample No 34, the film thickness of the first ZnO is 30 nm, and the film thickness of the second ZnO is 120 nm. The thickness ratio of the first ZnO to the second ZnO is $1/4$. The FWHM of the X-ray rocking curve is 2.7°, which is satisfactory.

In Sample Nos. 31 to 34, the range of the thickness ratio of the first ZnO to the second ZnO is $1/30$ to $1/3$. By setting the thickness ratio R3 in this range, the crystal orientation of the upper (i.e., the second) wurtzite thin films 17 and 27 becomes very good.

As has been described above, even with the configuration in which the thickness of the second wurtzite thin film 17 or 27 serving as the functional layer is reduced to about several hundred nanometers in order to deal with a high frequency band of sub-6 GHz band or higher, satisfactory crystal orientation is achieved. In actual use, the substrate 11 or 21 may be omitted.

The piezoelectric device of the embodiment is applicable not only to high-frequency bandpass noise filters for smartphones, but also to drive actuators for precision positioning devices, optical scanners for in-vehicle light detection and ranging (LiDAR), and other devices.

LISTING OF SYMBOLS 10, 20: piezoelectric device
11, 21: substrate
12: amorphous layer
13, 23: first wurtzite thin film
14, 24: first hexagonal metal layer
15, 25: first electrode layer
16, 26: second hexagonal metal layer
17, 27: second wurtzite thin film
18, 28: second electrode layer
110, 120: multilayer structure

What is claimed is:

1. A multilayer structure comprising:
a first wurtzite thin film;
a first hexagonal metal layer, wherein a crystal structure of the first hexagonal metal layer has a hexagonal structure;
a first electrode layer;
a second hexagonal metal layer, wherein a crystal structure of the second hexagonal metal layer has a hexagonal structure; and
a second wurtzite thin film, the first wurtzite thin film, the first hexagonal metal layer, the first electrode layer, the second hexagonal metal layer, and the second wurtzite thin film being stacked in this order,
wherein the first electrode layer is formed of a metallic material having an acoustic impedance higher than that of the second wurtzite thin film and formed of a material different from the first hexagonal metal layer and the second hexagonal metal layer,
wherein a thickness of the second wurtzite thin film is less than 1 μm; and wherein an amorphous layer is provided as an underlayer of the first wurtzite thin film.

2. The multilayer structure as claimed in claim 1, further comprising:

an amorphous layer provided under the first wurtzite thin film.

3. The multilayer structure as claimed in claim 2, wherein a thickness of the first wurtzite thin film is $\frac{1}{5}$ to $\frac{1}{1}$ of a thickness of the amorphous layer.

4. The multilayer structure as claimed in claim 1, wherein a thickness of each of the first hexagonal metal layer and the second hexagonal metal layer is $\frac{1}{10}$ to $\frac{1}{3}$ of a thickness of the first electrode layer.

5. The multilayer structure as claimed in claim 1, wherein a thickness of the first wurtzite thin film is $\frac{1}{30}$ to $\frac{1}{3}$ of a thickness of the second wurtzite thin film.

6. The multilayer structure as claimed in claim 1, wherein a thickness of the second wurtzite thin film is less than 1 μm.

7. The multilayer structure as claimed in claim 6, wherein the thickness of the second wurtzite thin film is less than or equal to 300 nm.

8. A piezoelectric device comprising:

the multilayer structure as claimed in claim 1; and a second electrode layer provided on the second wurtzite thin film in a stacking direction, wherein the second electrode layer is formed of a metallic material having an acoustic impedance higher than that of the second wurtzite thin film.

9. A manufacturing method of a multilayer structure comprising:

forming a first wurtzite thin film, a first hexagonal metal layer, a first electrode layer, a second hexagonal metal layer, and a second wurtzite thin film in this order on a substrate, wherein a crystal structure of the first hexagonal metal layer has a hexagonal structure;

wherein a crystal structure of the second hexagonal metal layer has a hexagonal structure;

wherein the first electrode layer is formed of a metallic material having an acoustic impedance higher than that of the second wurtzite thin film and formed of a material different from the first hexagonal metal layer and the second hexagonal metal layer, wherein a thickness of the second wurtzite thin film is less than 1 μm; and wherein an amorphous layer is provided as an underlayer of the first wurtzite thin film.

10. A manufacturing method of a piezoelectric device comprising:

forming a first wurtzite thin film, a first hexagonal metal layer, a first electrode layer, a second hexagonal metal layer, a second wurtzite thin film, and a second electrode layer in this order on a substrate, wherein a crystal structure of the first hexagonal metal layer has a hexagonal structure;

wherein a crystal structure of the second hexagonal metal layer has a hexagonal structure;

wherein the first electrode layer and the second electrode layer are formed of a metallic material having an acoustic impedance higher than that of the second wurtzite thin film and formed of a material different from the first hexagonal metal layer and the second hexagonal metal layer, wherein a thickness of the second wurtzite thin film is less than 1 μm; and wherein an amorphous layer is provided as an underlayer of the first wurtzite thin film.

* * * * *